US008835845B2

(12) United States Patent
Hong

(10) Patent No.: US 8,835,845 B2
(45) Date of Patent: Sep. 16, 2014

(54) IN-SITU STEM SAMPLE PREPARATION

(75) Inventor: Liang Hong, Coquitlam (CA)

(73) Assignee: FEI Company, Hillsboro, OR (US)

( * ) Notice: Subject to any disclaimer, the term of this patent is extended or adjusted under 35 U.S.C. 154(b) by 1047 days.

(21) Appl. No.: 11/809,715

(22) Filed: Jun. 1, 2007

(65) Prior Publication Data

US 2008/0296498 A1    Dec. 4, 2008

(51) Int. Cl.
 *G21K 5/04* (2006.01)
(52) U.S. Cl.
 USPC ........... 250/311; 250/307; 250/309; 250/310; 250/492.1; 250/492.3; 430/296; 430/297; 430/298; 430/299
(58) Field of Classification Search
 USPC ................ 118/715, 723 CB, 723 EB, 723 FI; 250/306, 307, 309, 310, 311, 492.2, 250/492.21, 492.3, 305, 440.11, 442.11, 250/492.1; 430/296, 297, 298, 299
 See application file for complete search history.

(56) References Cited

U.S. PATENT DOCUMENTS

| 5,435,850 | A | 7/1995 | Rasmussen |
| 5,851,413 | A | 12/1998 | Casella et al. |
| 6,841,788 | B1 | 1/2005 | Robinson |
| 6,963,068 | B2 | 11/2005 | Asselbergs et al. |
| 6,982,429 | B2 | 1/2006 | Robinson |
| 7,423,263 | B2 | 9/2008 | Hong et al. |
| 7,928,377 | B2 | 4/2011 | Ishitani et al. |
| 2005/0035306 | A1* | 2/2005 | Iwasaki ...................... 250/492.2 |
| 2006/0076489 | A1* | 4/2006 | Ohshima et al. .............. 250/310 |
| 2007/0057182 | A1 | 3/2007 | Feuerbaum et al. |
| 2007/0181831 | A1* | 8/2007 | Tokuda et al. ........... 250/492.21 |
| 2008/0258056 | A1* | 10/2008 | Zaykova-Feldman et al. ............................. 250/307 |

FOREIGN PATENT DOCUMENTS

| JP | 3805547 | 8/2006 |
| JP | 2007-018928 | 1/2007 |
| JP | 3805547 | 5/2011 |
| WO | WO2008049133 | 4/2008 |

OTHER PUBLICATIONS

Zeiss, Notice of Opposition for European Application No. 08157258.8, Apr. 4, 2011, 10 pages.
Delta Patents, Response to Notice of Opposition for European Application No. 08157258.8, Oct. 4, 2011, 10 pages.
Japanese Office Action 2008-140448, Jul. 17, 2012, 2 pages.
Notice of Opposition for European Application No. 08157258.8, Apr. 18, 2011.
Translation from German to English of the Notice of Opposition for European Application No. 08157258.8, Apr. 18, 2011.

* cited by examiner

*Primary Examiner* — Nicole Ippolito
(74) *Attorney, Agent, or Firm* — Scheinberg & Associates, PC; Michael O. Scheinberg

(57) ABSTRACT

A method for TEM/STEM sample preparation and analysis that can be used in a FIB-electron microscope system without a flip stage. The method allows a dual beam FIB electron microscope system with a typical tilt stage having a maximum tilt of approximately 60° to be used to extract a TEM/STEM sample to from a substrate, mount the sample onto a sample holder, thin the sample using FIB milling, and rotate the sample so that the sample face is perpendicular to a vertical electron beam column for TEM/STEM imaging.

14 Claims, 19 Drawing Sheets

US 8,835,845 B2

IN-SITU STEM SAMPLE PREPARATION

TECHNICAL FIELD OF THE INVENTION

The present invention relates to preparation of samples and methods of sample handling for analysis by scanning transmission electron microscopes.

BACKGROUND OF THE INVENTION

Semiconductor manufacturing, such as the fabrication of integrated circuits, typically entails the use of photolithography. A semiconductor substrate on which circuits are being formed, usually a silicon wafer, is coated with a material, such as a photoresist, that changes solubility when exposed to radiation. A lithography tool, such as a mask or reticle, positioned between the radiation source and the semiconductor substrate casts a shadow to control which areas of the substrate are exposed to the radiation. After the exposure, the photoresist is removed from either the exposed or the unexposed areas, leaving a patterned layer of photoresist on the wafer that protects parts of the wafer during a subsequent etching or diffusion process.

The photolithography process allows multiple integrated circuit devices or electromechanical devices, often referred to as "chips," to be formed on each wafer. The wafer is then cut up into individual dies, each including a single integrated circuit device or electromechanical device. Ultimately, these dies are subjected to additional operations and packaged into individual integrated circuit chips or electromechanical devices.

During the manufacturing process, variations in exposure and focus require that the patterns developed by lithographic processes be continually monitored or measured to determine if the dimensions of the patterns are within acceptable ranges. The importance of such monitoring, often referred to as process control, increases considerably as pattern sizes become smaller, especially as minimum feature sizes approach the limits of resolution available by the lithographic process. In order to achieve ever-higher device density, smaller and smaller feature sizes are required. This may include the width and spacing of interconnecting lines, spacing and diameter of contact holes, and the surface geometry such as corners and edges of various features. Features on the wafer are three-dimensional structures and a complete characterization must describe not just a surface dimension, such as the top width of a line or trench, but a complete three-dimensional profile of the feature. Process engineers must be able to accurately measure the critical dimensions (CD) of such surface features to fine tune the fabrication process and assure a desired device geometry is obtained.

Typically, CD measurements are made using instruments such as a scanning electron microscope (SEM). In a scanning electron microscope (SEM), a primary electron beam is focused to a fine spot that scans the surface to be observed. Secondary electrons are emitted from the surface as it is impacted by the primary beam. The secondary electrons are detected, and an image is formed, with the brightness at each point of the image being determined by the number of secondary electrons detected when the beam impacts a corresponding spot on the surface. As features continue to get smaller and smaller, however, there comes a point where the features to be measured are too small for the resolution provided by an ordinary SEM.

Transmission electron microscopes (TEMs) allow observers to see extremely small features, on the order of nanometers. In contrast to SEMs, which only image the surface of a material, TEM also allows analysis of the internal structure of a sample. In a TEM, a broad beam impacts the sample and electrons that are transmitted through the sample are focused to form an image of the sample. The sample must be sufficiently thin to allow many of the electrons in the primary beam to travel though the sample and exit on the opposite site. Samples are typically less than 100 nm thick.

In a scanning transmission electron microscope (STEM), a primary electron beam is focused to a fine spot, and the spot is scanned across the sample surface. Electrons that are transmitted through the substrate are collected by an electron detector on the far side of the sample, and the intensity of each point on the image corresponds to the number of electrons collected as the primary beam impacts a corresponding point on the surface.

Because a sample must be very thin for viewing with transmission electron microscopy (whether TEM or STEM), preparation of the sample can be delicate, time-consuming work. The term "TEM" as used herein refers to a TEM or an STEM and references to preparing a sample for a TEM are to be understood to also include preparing a sample for viewing on an STEM. The term "STEM" as used herein also refers to both TEM and STEM. One method of preparing a TEM sample is to cut the sample from a substrate using an ion beam. A probe is attached to the sample, either before or after the sample has been entirely freed. The probe can be attached, for example, by static electricity, FIB deposition, or an adhesive. The sample, attached to the probe, is moved away from the substrate from which it was extracted and typically attached to a TEM grid or sample holder using FIB deposition, static electricity, or an adhesive.

FIG. 1 shows a typical TEM sample holder 10, which comprises a partly circular 3 mm ring. In some applications, samples 20 can attached to one or more fingers 14 of the TEM sample holder by ion beam deposition or an adhesive. The sample extends from the finger 16 so that in a TEM an electron beam (shown in FIG. 13) will have a free path through the sample 20 to a detector under the sample when the plane of the TEM grid is perpendicular to the electron beam.

Several techniques are known for preparing TEM specimens. These techniques may involve cleaving, chemical polishing, mechanical polishing, or broad beam low energy ion milling, or combining one or more of the above. The disadvantage to these techniques is that they are not site-specific and often require that the starting material be sectioned into smaller and smaller pieces, thereby destroying much of the original sample.

Other techniques generally referred to as "lift-out" techniques use focused ion beams to cut the sample from a substrate or bulk sample without destroying or damaging surrounding parts of the substrate. Such techniques are useful in analyzing the results of processes used in the fabrication of integrated circuits, as well as materials general to the physical or biological sciences. These techniques can be used to analyze samples in any orientation (e.g., either in cross-section or in plan view). Some techniques extract a sample sufficiently thin for use directly in a TEM; other techniques extract a "chuck" or large sample that requires additional thinning before observation. In addition, these "lift-out" specimens may also be directly analyzed by other analytical tools, other than TEM. Techniques where the sample is extracted from the substrate outside the FIB system vacuum chamber (as when the entire wafer is transferred to another tool for sample removal) are commonly referred to as "ex-situ" techniques; techniques where the sample removal occurs inside the vacuum chamber are called "in-situ" techniques. In-situ lift out techniques are discussed in U.S. Provisional App. to Tanguay et al. for "S/TEM Sample and Method of Extracting S/TEM Sample" filed May 3, 2007 (which is hereby incorporated by reference but which is not admitted to be prior art by virtue of its inclusion in this Background Section)

In-situ lift out of a chunk-type sample is typically accomplished in the following successive steps, as shown in FIGS. 2-5. First, as shown in FIG. 2 to FIG. 5, the sample 20 is completely or partially separated from the substrate 21 by milling with a focused ion beam 22. This step is typically accomplished by using a dual beam FIB/SEM system such as the Expida™ 1255 DualBeam™ System, available from FEI Company of Hillsboro, Oreg., the assignee of the present invention. Next, as shown in FIG. 4, a microprobe tip 23 is attached to the sample by FIB-induced chemical vapor deposition. In the case of only partially separated samples, the sample is then completely freed by further FIB milling. This process typically results in a wedge-shaped sample 60, as shown in FIG. 6, which is approximately 10×5×5 μm in size. Top surface 62 is thus approximately 10 μm long×5 μm wide.

As shown in FIG. 5 and FIG. 7, the sample is then transported by the attached microprobe to a TEM sample holder 24. Transporting the sample typically does not change its orientation, so its top surface will still be oriented perpendicular to the plane of the TEM sample holder. The sample 20 is attached to the sample holder 24 (again with FIB-induced CVD) and then end of the sample where the microprobe 23 is attached is cut free. This sequence of steps is illustrated in FIG. 8 to FIG. 10.

At this point, the sample is thinned into an electron-transparent thin section, either in the same FIB system or after transfer to a second FIB system. Sample thinning is shown by FIGS. 11-13. The sample can then be imaged with an electron beam 25 in a TEM or STEM as shown in FIG. 14. A typical dual beam FIB/SEM has the SEM column oriented normal to the sample (at 90 degrees) and the FIB column at an angle of approximately 52 degrees. Because the FIB should be roughly perpendicular to the top surface of the sample during the thinning process (and thus parallel to the desired face of the thinned sample) and the SEM should be perpendicular to the sample face during STEM imaging, it is often necessary to change the sample orientation and reposition the sample between the thinning and imaging steps. As a result, on many prior art systems it is necessary to break vacuum in order to reposition the sample between the thinning and imaging steps.

Further, it is often desirable to image the sample during milling using the SEM. Imaging using SEM or STEM during sample thinning allows the sample thickness and location of the feature of interest within the sample to be monitored directly. STEM imaging can be used even when the sample surface is at an angle to the electron beam (as would be the case when the sample is oriented toward the ion beam during milling) by compensating for the angle mathematically. SEM imaging can also be used to monitor sample in the same fashion that cross-sections for sub-100 nm features are measured by a CD-SEM. The use of top-down SEM imaging to control FIB thinning is discussed in U.S. Provisional App. 60/853,183 by Blackwood et al. for "Method for S/TEM Sample Analysis" (which is hereby incorporated by reference but which is not admitted to be prior art by virtue of its inclusion in this Background Section).

Although typical tilting sample stages are used in many FIB/SEM systems, such stages typically have a maximum tilt of approximately 60 degrees. This is obviously not sufficient to allow the sample to be rotated so that the SEM is perpendicular to the sample face (at 90 degrees).

Pivoting sample stages with a rotational range of more than 90 degrees are known. One such "flipstage" arrangement is described in U.S. Pat. No. 6,963,068 to Asselbergs et al. for "Method for the manufacture and transmissive irradiation of a sample, and particle-optical system," which is hereby incorporated by reference. This type of stage is commercially available as the Flipstage™ from FEI Company of Hillsboro, Oreg., the assignee of the present invention.

Although flipstage systems provide a number of advantages, such systems are expensive and not easily added to existing FIB/SEM systems. What is needed is an improved method for TEM sample preparation and analysis that allows the sample to be correctly repositioned for FIB milling, SEM/STEM imaging from above, and STEM imaging through the sample and can be used in a Dual Beam FIB-STEM system without a flip stage.

SUMMARY OF THE INVENTION

An object of the invention, therefore, is to provide an improved method for STEM sample preparation and analysis that can be used in a FIB-STEM system without a flip stage. Preferred embodiments of the present invention allow a dual beam FIB-STEM system with a typical tilt stage having a maximum tilt of approximately 60° to be used to extract a STEM sample to from a substrate, mount the sample onto a TEM sample holder, thin the sample using FIB milling, and rotate the sample so that the sample face is perpendicular to a vertical electron column for STEM imaging.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

Preferred embodiments of the present invention provide an improved method for STEM sample preparation and analysis that can be used in a FIB-STEM system without a flip stage.

A preferred method or apparatus of the present invention has many novel aspects, and because the invention can be embodied in different methods or apparatuses for different purposes, not every aspect need be present in every embodiment. Moreover, many of the aspects of the described embodiments may be separately patentable.

A preferred method of preparing a sample for STEM imaging according to the present invention comprises the following steps:

providing a substrate inside a dual beam FIB/STEM system, and said system comprising a vertical SEM column and a FIB column oriented at an angle relative to the SEM column;
  providing a sample holder for holding an extracted STEM sample, the sample holder mounted on a sample stage inside the FIB/STEM system, said sample stage having a sample stage plane and comprising a rotating and tilting stage with a maximum tilt of less than 90 degrees, and said sample holder having a sample holder plane perpendicular to the sample stage plane;
  freeing a sample from the substrate using an ion beam, said freed sample having a top surface;
  tilting the sample holder to a first angle by tilting the sample stage;
  mounting the sample onto the tilted TEM sample holder so that the top surface of the sample is oriented at said first angle relative to the sample holder plane;
  tilting the sample stage so that the sample stage plane is at a 0 degree tilt;
  rotating the sample holder by 180 degrees;
  tilting the rotated sample holder to a second angle such that the combination of the first angle and the second angle results in the top surface of the mounted sample being oriented perpendicular to the orientation of the FIB column;
  thinning the sample using the ion beam by milling the sample, said milling producing a sample face parallel to the orientation of the FIB column;
  tilting the sample holder to third angle, such that the combination of the first angle and the third angle equals approximately 90 degrees and the sample face is oriented substantially perpendicular to the vertical SEM column; and
  viewing the mounted sample with the STEM.

Figure 15:
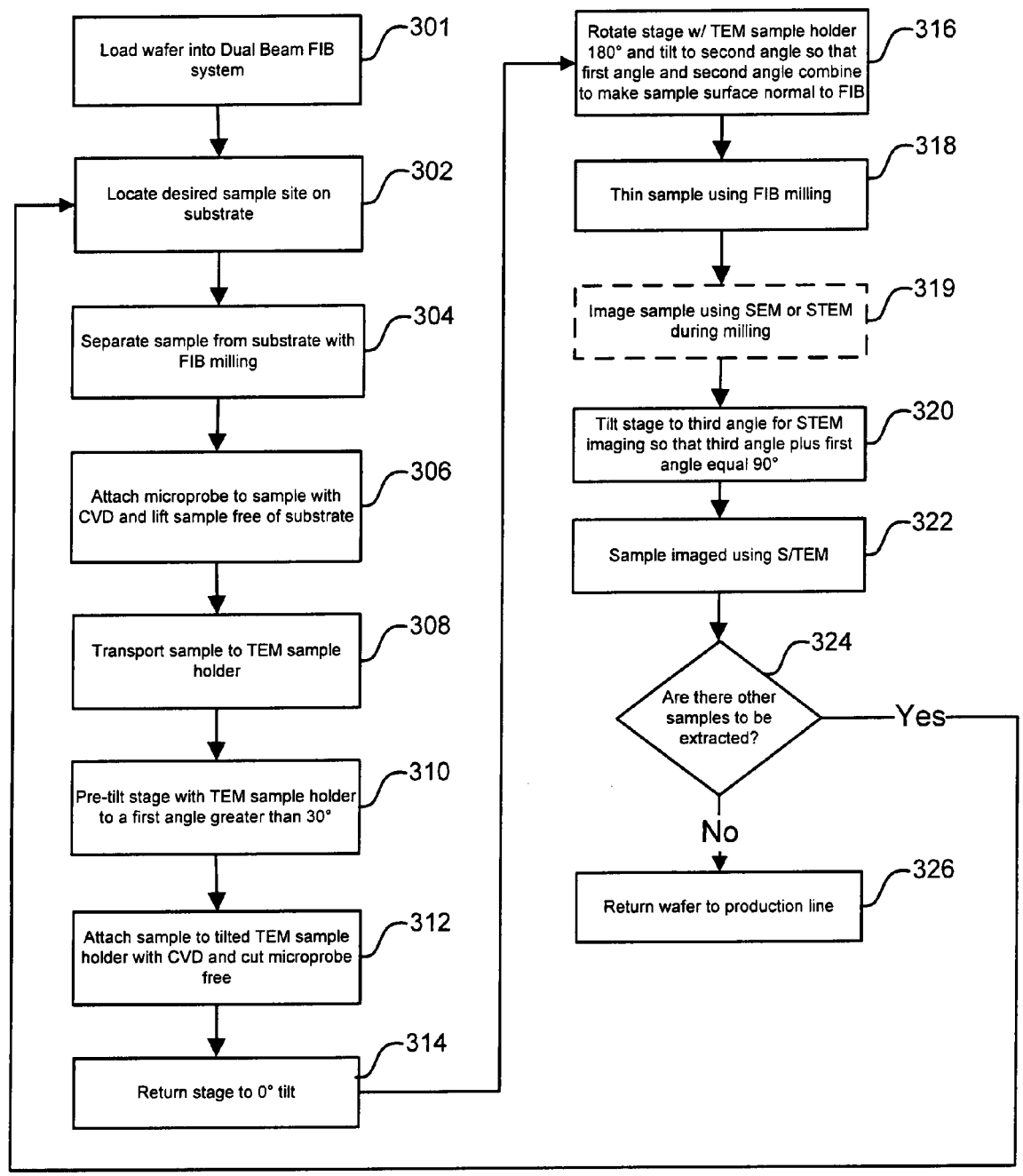
FIG. 15 is a flowchart showing the steps in processing and imaging a sample according to the present invention.

FIG. 15 is a flowchart showing the steps of creating and imaging one or more samples according to a preferred embodiment of the present invention. Various steps in the process are shown in FIGS. 16 through 22.

Figure 16:
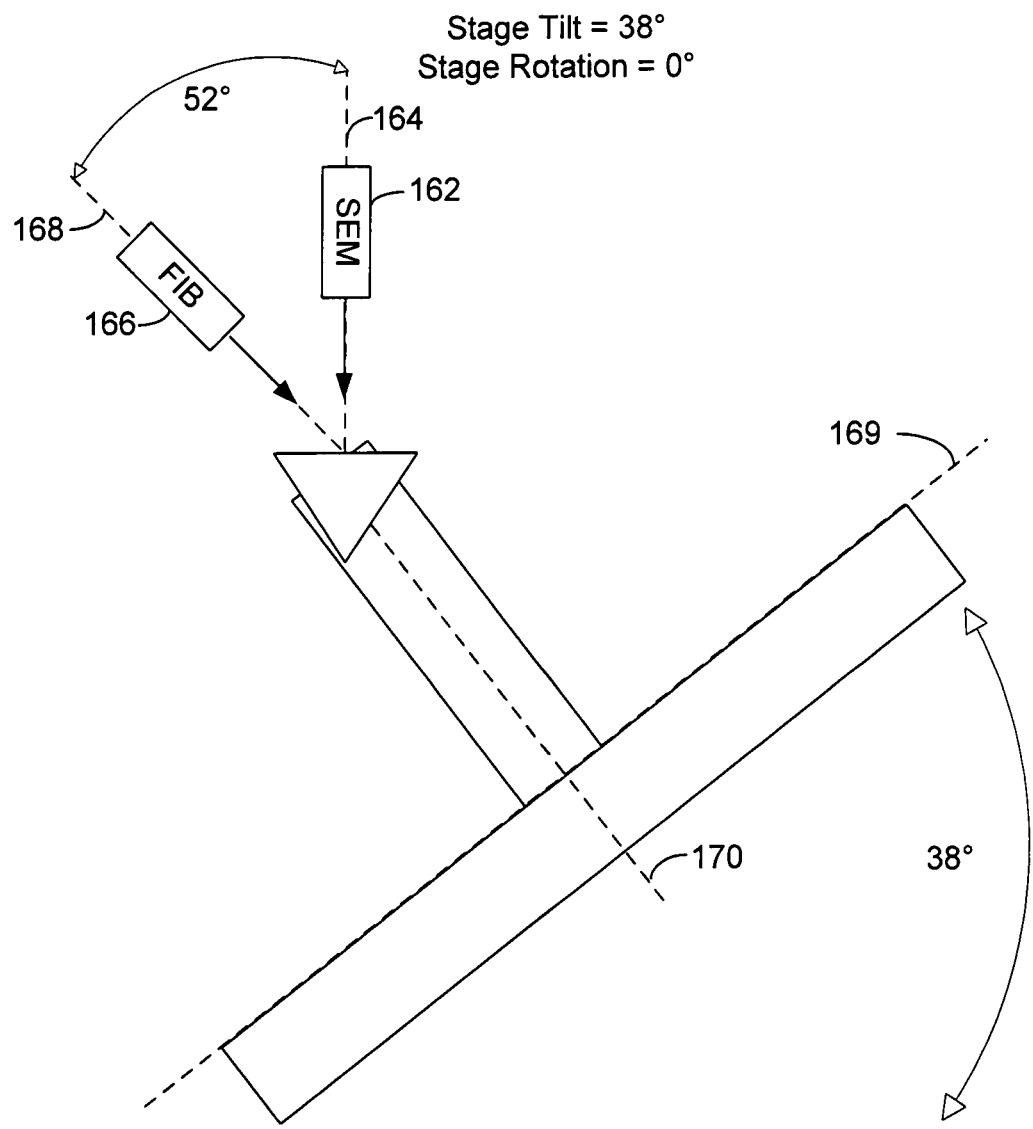
FIGS. 16-21 show various steps in processing and imaging a sample according to the present invention.

First, in step 301, a substrate such as a semiconductor wafer is loaded into a Dual Beam FIB/STEM system having both a FIB column and a SEM column. Referring also to FIG. 16, the typical dual-beam configuration is an electron column 162 having a vertical axis 164 with an ion column 166 having an axis 168 tilted with respect to the vertical (usually at a tilt of approximately 52 degrees). Wafers are preferably transferred by way of a multi-wafer carrier and auto-loading robot, as in well known in the art, although wafers can also be transferred manually.

In step 302, the location of a sample (containing a feature of interest) to be extracted from a substrate is determined. For example, the substrate may be a semiconductor wafer or portion thereof and the portion to be extracted may include a portion of an integrated circuit that is to be observed using the STEM.

Figure 2:
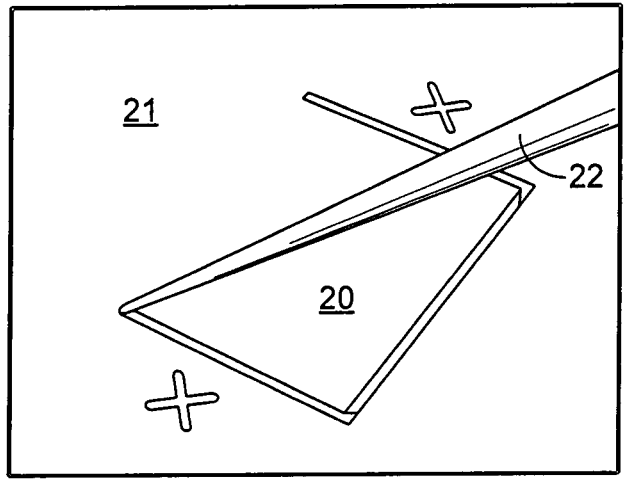
FIGS. 2-5 show the steps in a typical in-situ lift out of a chunk-type TEM sample according to the prior art.
Figure 3:
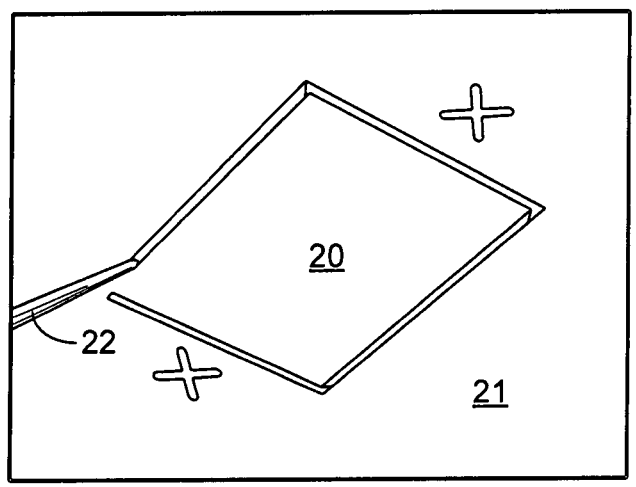
Figure 4:
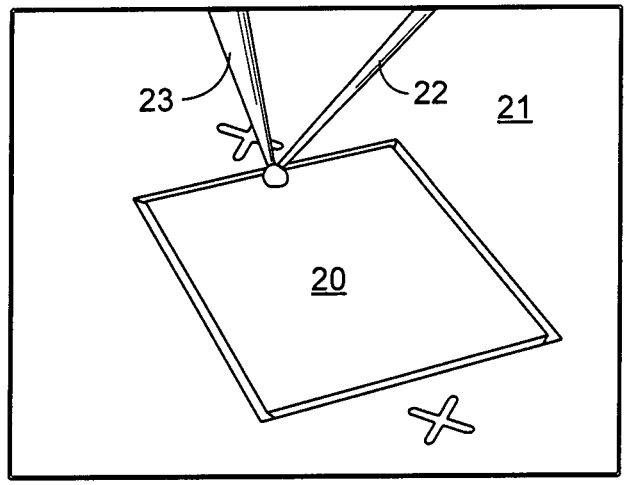
Figure 5:
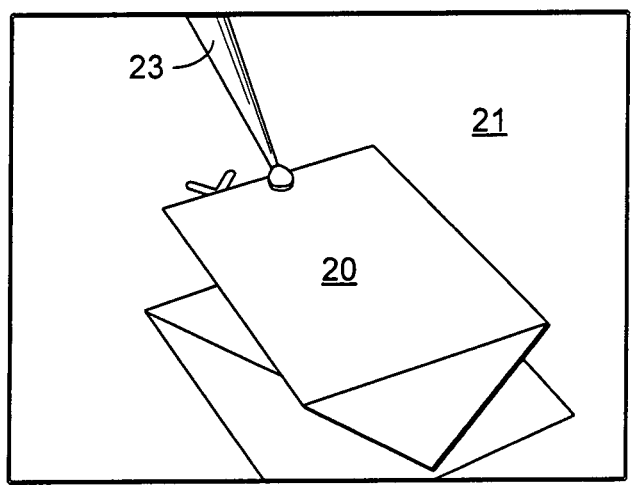
Figure 6:
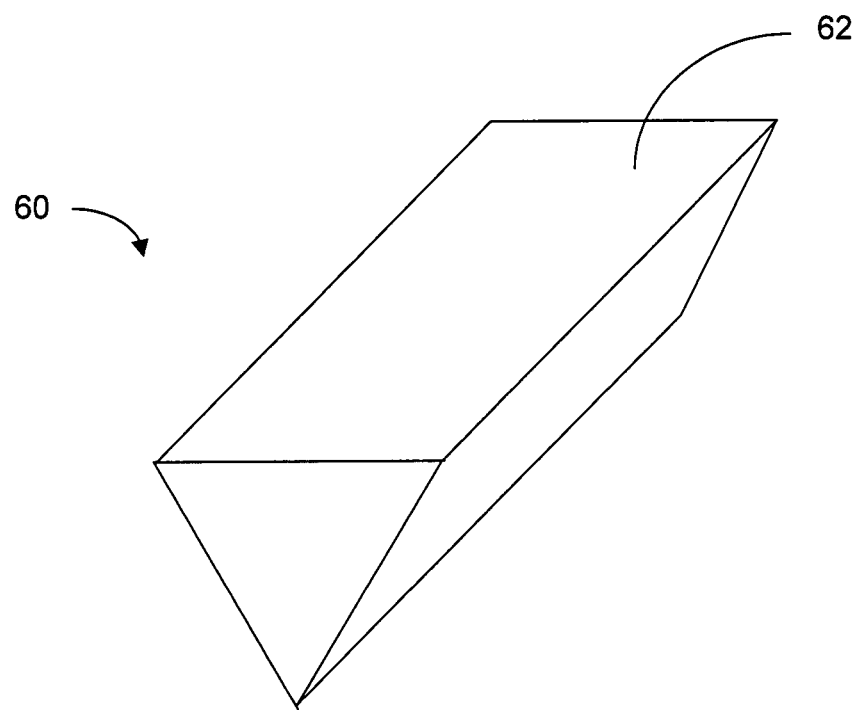
FIG. 6 shows a typical wedge-shaped sample produced by the process shown in FIGS. 2-5.
Figure 7:
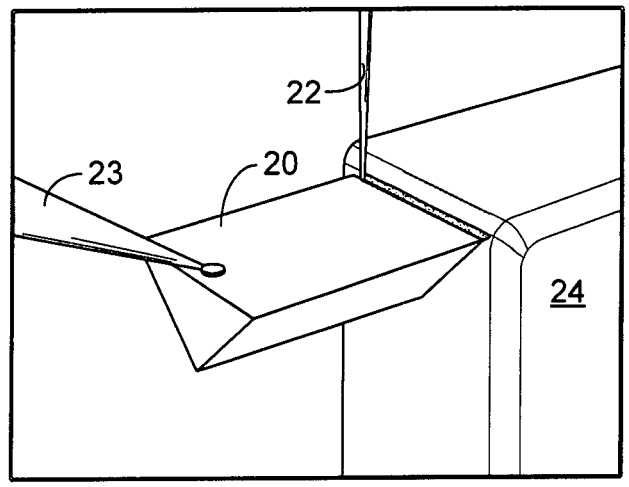
FIGS. 7-10 show the process of attaching the sample of FIGS. 2-5 to a TEM sample holder according to the prior art.
Figure 8:
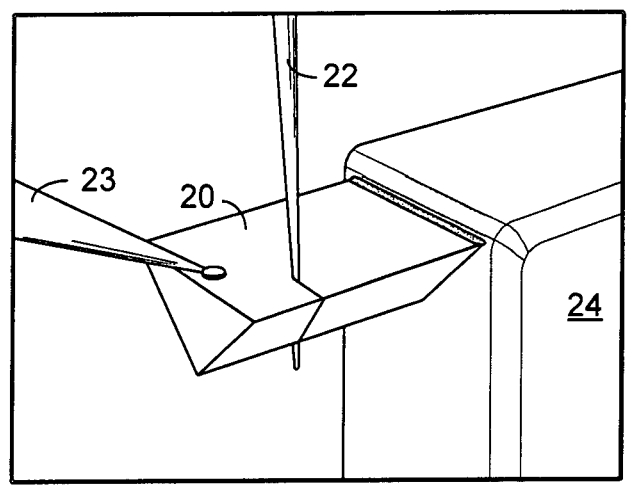
Figure 9:
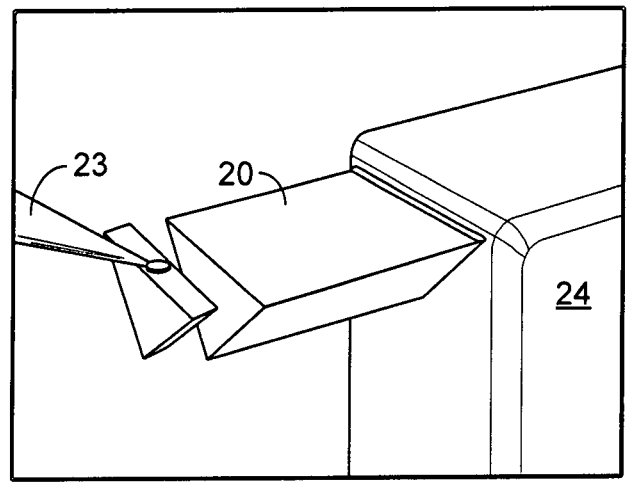
Figure 10:
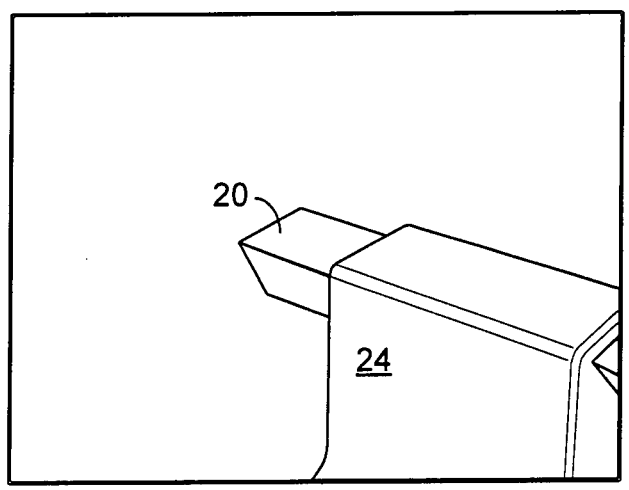
Figure 11:
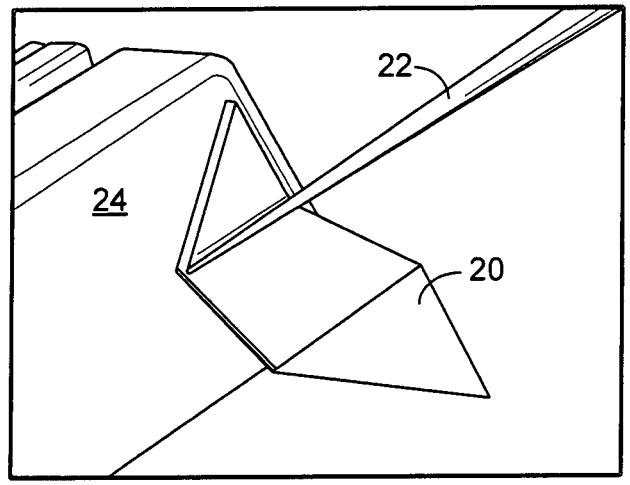
FIGS. 11-13 show the process of thinning the sample of FIGS. 6-9 according to the prior art.
Figure 12:
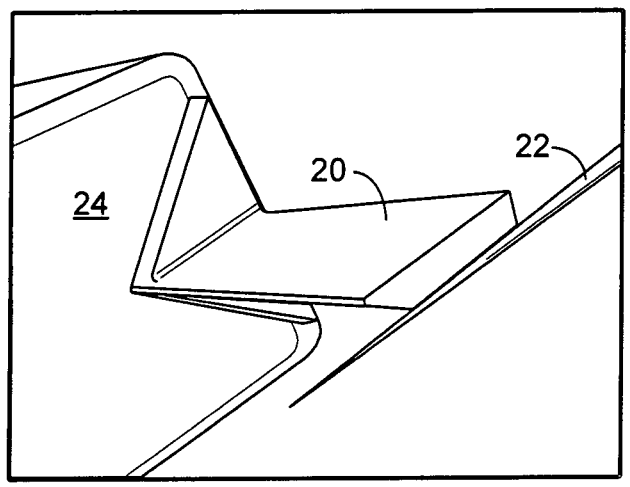
Figure 13:
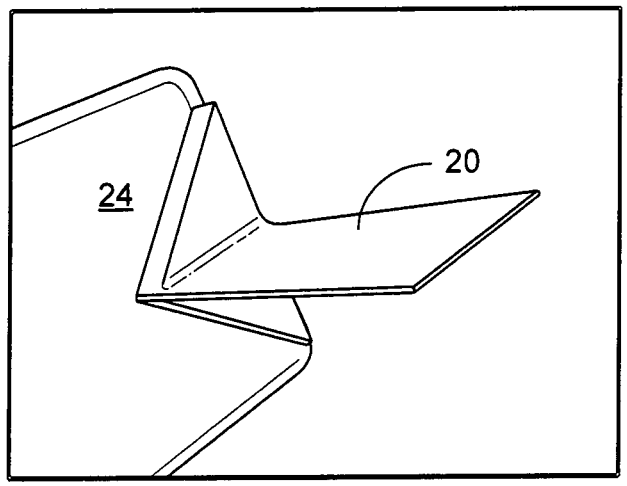
Figure 14:
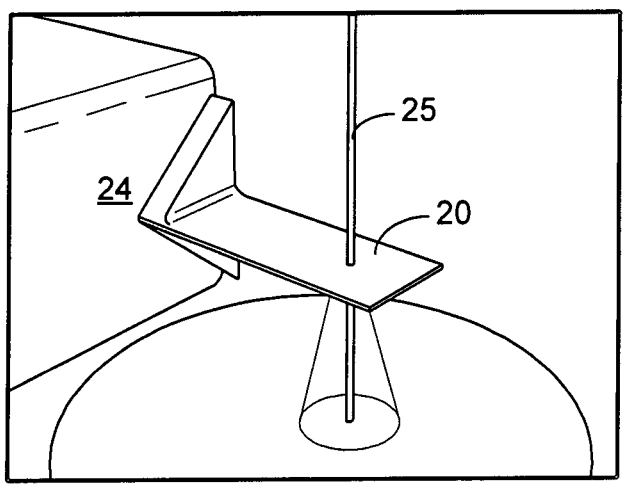
FIG. 14 illustrates imaging the thinned sample of FIGS. 10-13 using an STEM according to the prior art.

In step 304, the sample is separated from the substrate by milling with a focused ion beam as discussed above and shown in FIGS. 2-3. Next, in step 306, a microprobe tip is attached to the sample by FIB-induced chemical vapor deposition and the sample is lifted free of the substrate as discussed above and shown in FIGS. 4-5. Steps 304 and 306 are preferably carried out with the FIB/STEM sample stage at a tilt of zero degrees (so that the sample stage plane is perpendicular to the vertical).

Figure 1:
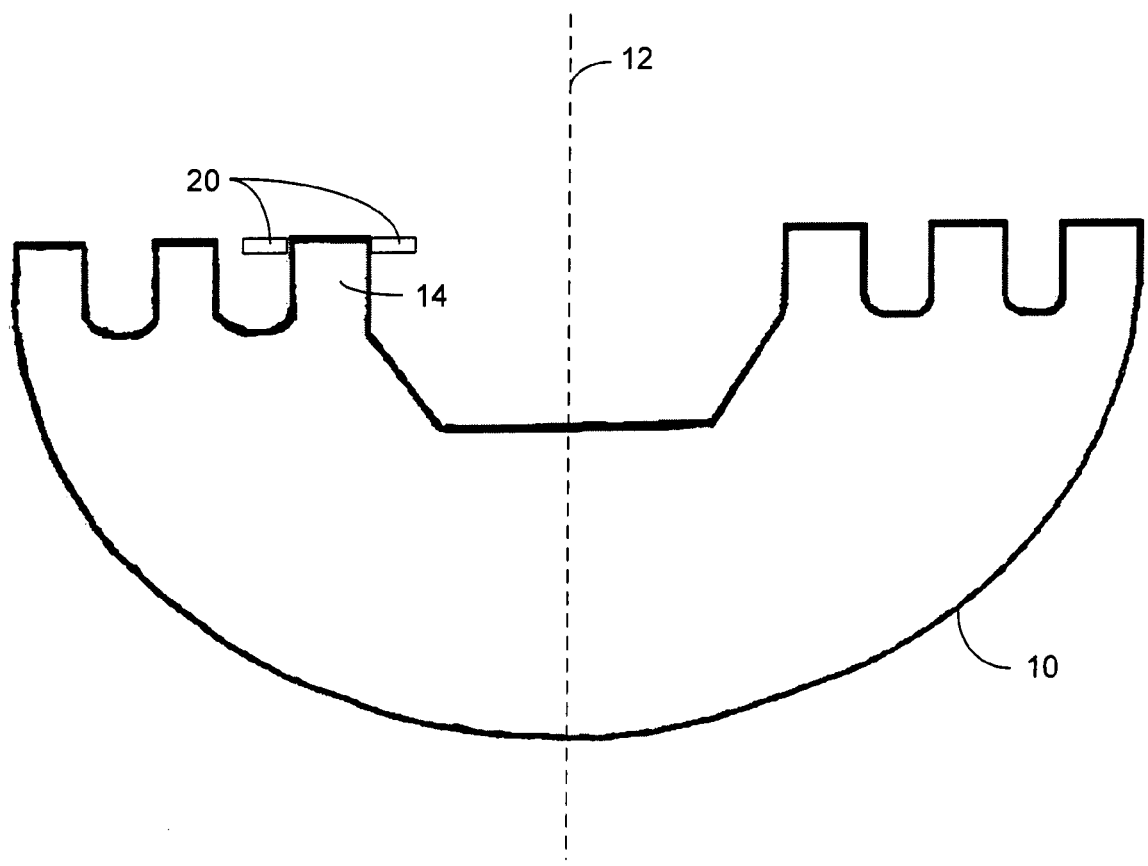
FIG. 1 shows a typical prior art TEM sample holder.

In step 308, the sample is then transported by the attached microprobe to a TEM sample holder. The sample holder will preferably comprise a TEM finger grid such as the one shown in FIG. 1. Referring also to FIG. 16, the TEM sample holder is preferably mounted vertically onto a stage so that the vertical axis of the TEM sample holder 12 is perpendicular to the plane 169 of the sample stage surface. Further, the stage will preferably comprise a rotating and tilting stage having a maximum tilt of less than 90 degrees. (In other words the angle of the sample stage plane at maximum tilt will be less than 90 degrees relative to the sample stage plane at a tilt of zero degrees.) In some circumstances it might be desirable to employ the method of the present invention using a stage with a maximum tilt of 90 degrees or greater, however, normally with this type of flip stage the sample can just be mounted as usual and tilted to the desired angle for milling and STEM viewing.

Figure 23:
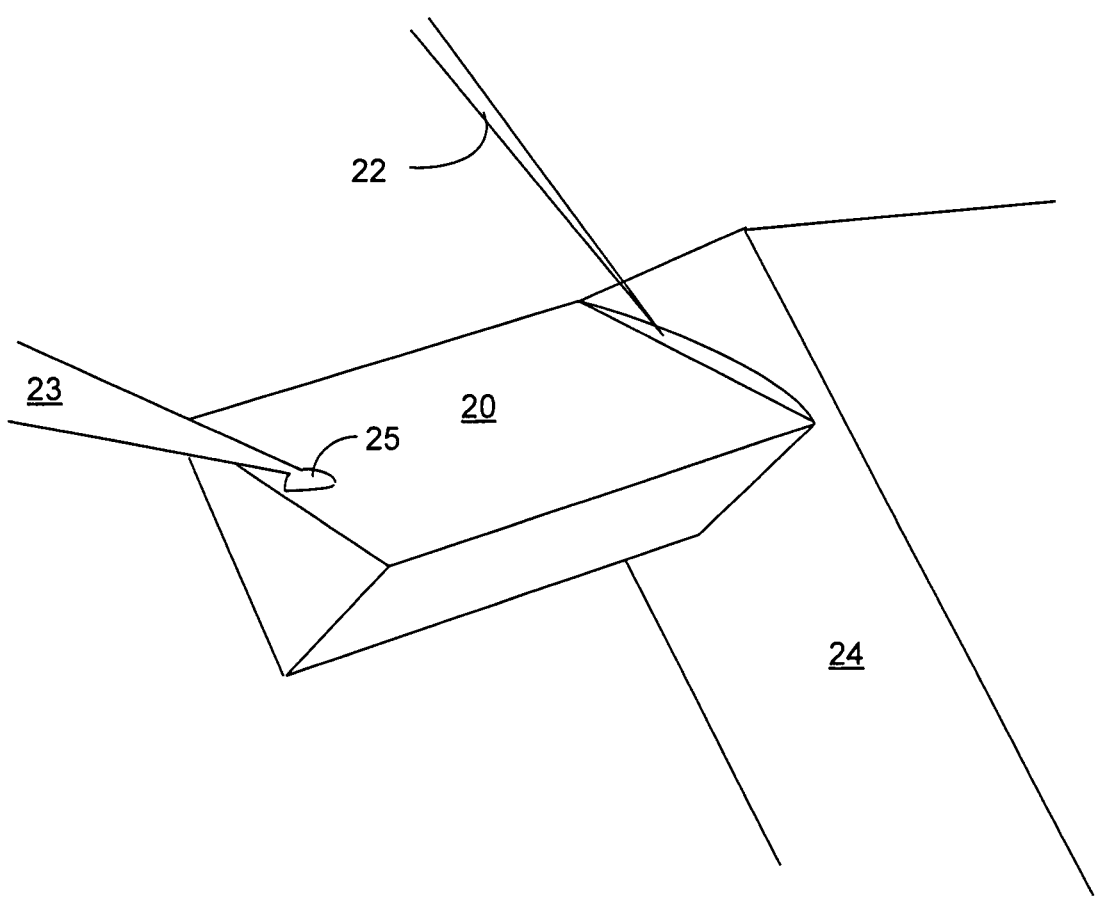
FIGS. 23-25 show the process of mounting and thinning a sample according to the present invention.

In step 310, the stage holding the TEM sample holder is preferably pre-tilted to a first angle by tilting the sample stage (the sample stage plane 169 is tilted to a first angle with respect to the sample stage plane at a tilt of 0 degrees). For example in FIG. 16, the TEM stage has been pre-tilted to an angle of 38 degrees, which in turn tilts the TEM sample holder plane 170 to an angle of 38 degrees (relative to the TEM sample holder plane with the stage tilt at zero degrees). The first angle will preferably be in a range between the maximum tilt of the stage and the difference between that maximum tilt and 90 degrees. For example, where the stage has a maximum tilt of 60 degrees, the first angle will preferably be from 30 to 60 degrees. In step 312, the sample (which remains at a tilt of zero degrees) is then attached to the tilted grid as shown in FIG. 23 and the attached microprobe cut free. Because the TEM sample holder is tilted to a first angle and because the sample top surface remains in its original orientation, the top surface of the mounted sample will be located at the same first angle with respect to the TEM sample holder plane.

Figure 17:
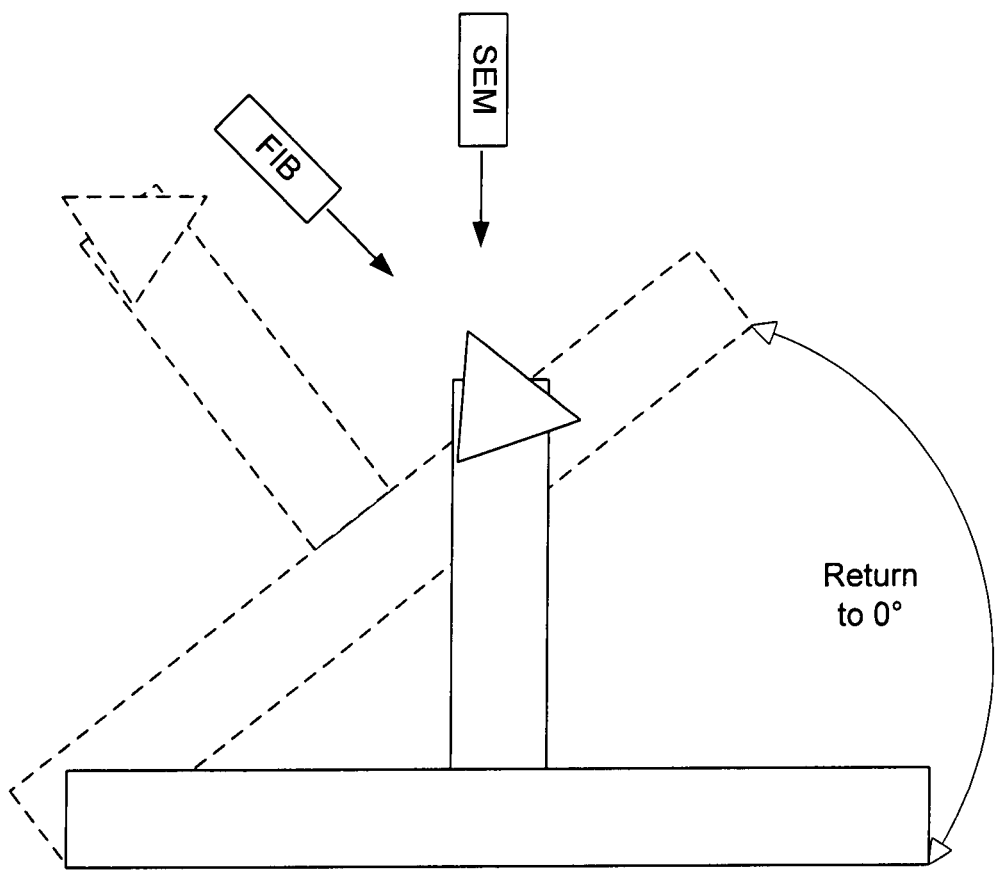
Figure 18:
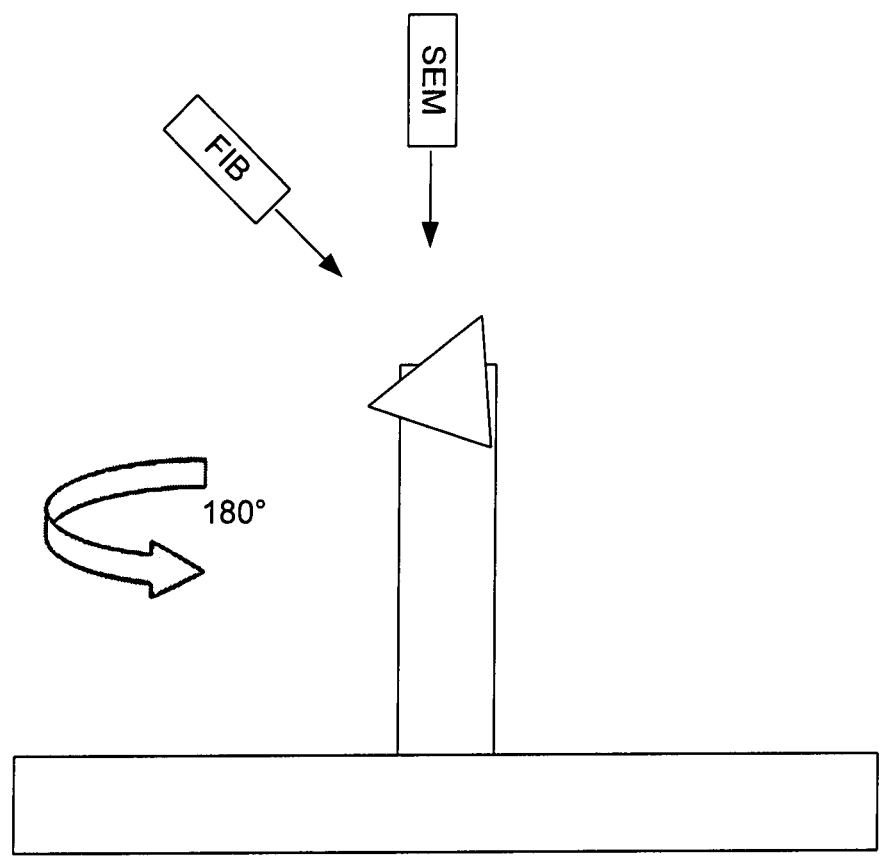
Figure 19:
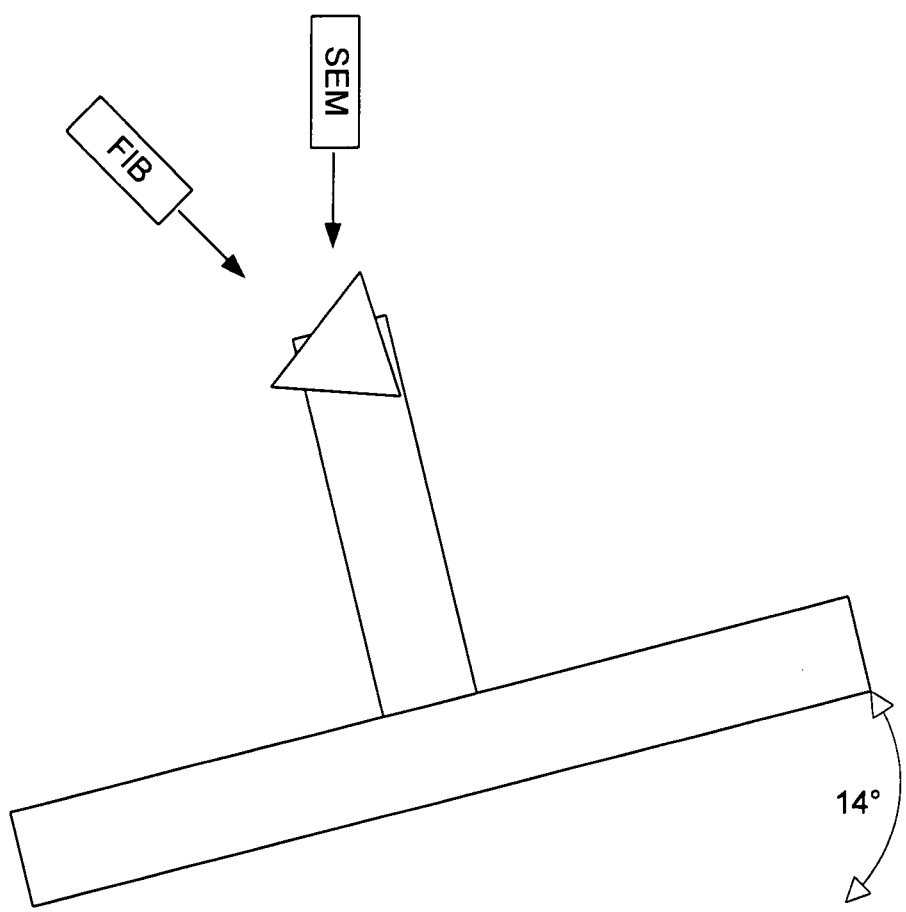

In step 314, the stage (along with the sample holder) is returned to zero degree tilt as shown in FIG. 17. In step 316, shown in FIGS. 18 and 19, the stage is then rotated by 180 degrees and then tilted to a second angle, 14 degrees in the embodiment shown in FIG. 19. The first pre-tilt angle (38°) and the second angle (14°) combine to make the sample surface normal to the FIB column, which is oriented at a 52 degree tilt with respect to the vertical.

Figure 20:
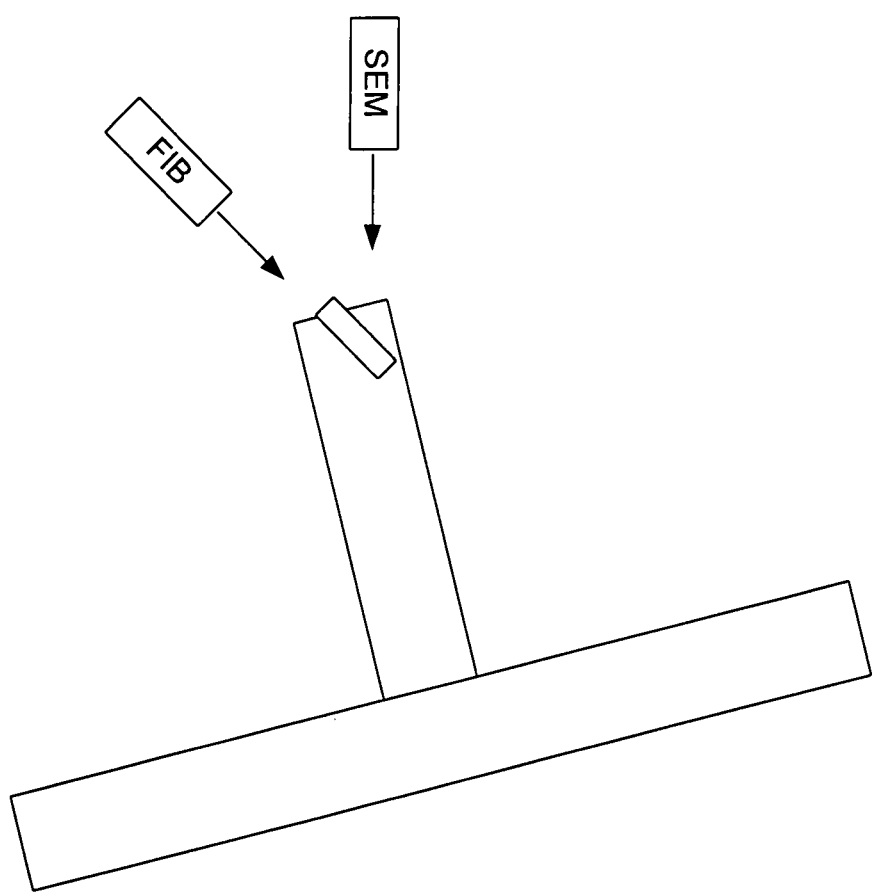
Figure 24:
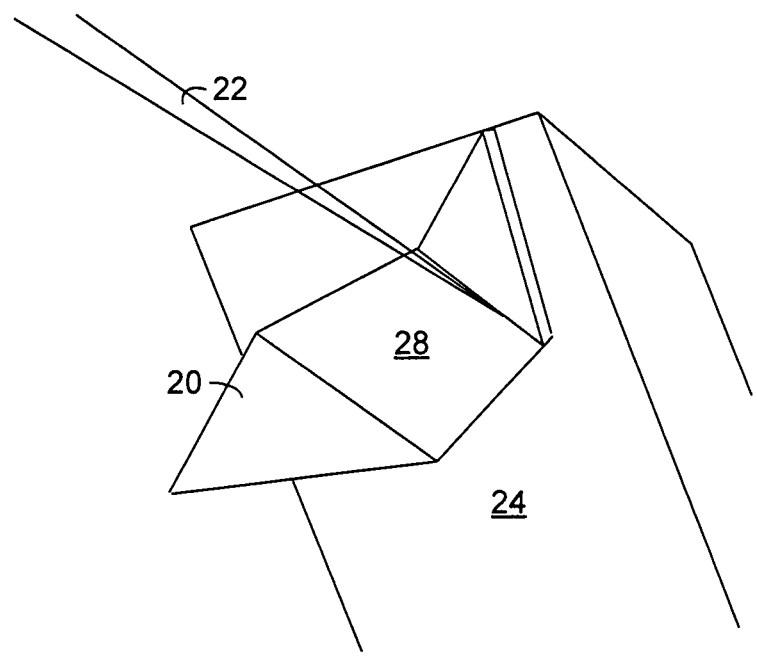
Figure 25:
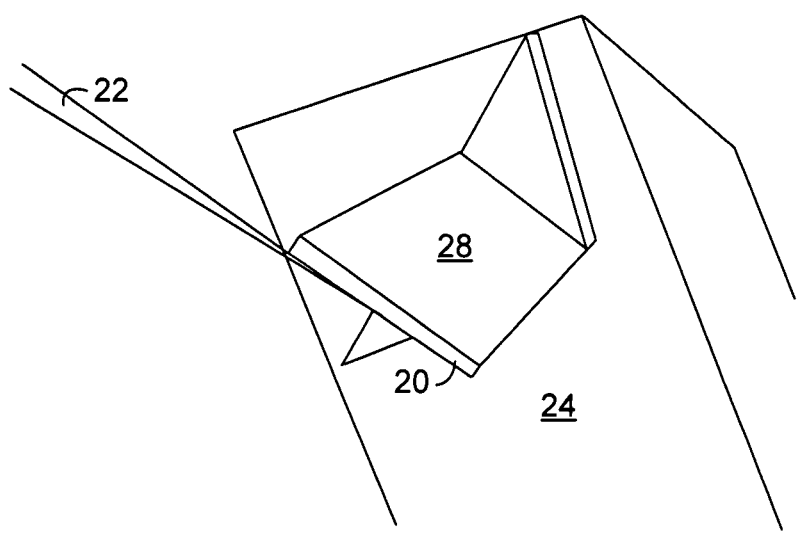

At this point, in step 318, the sample is thinned into an electron-transparent thin section having a sample face 28 by milling with the ion beam as shown in FIG. 20 and also in FIGS. 24 and 25. During FIB milling, the sample can be imaged using either SEM or STEM. If needed, the stage can be tilted by a few degrees to either side for better quality control. If only a final SEM image is required then the sample can be thinned on one side only; otherwise the sample is preferably thinned from both sides.

Figure 26:
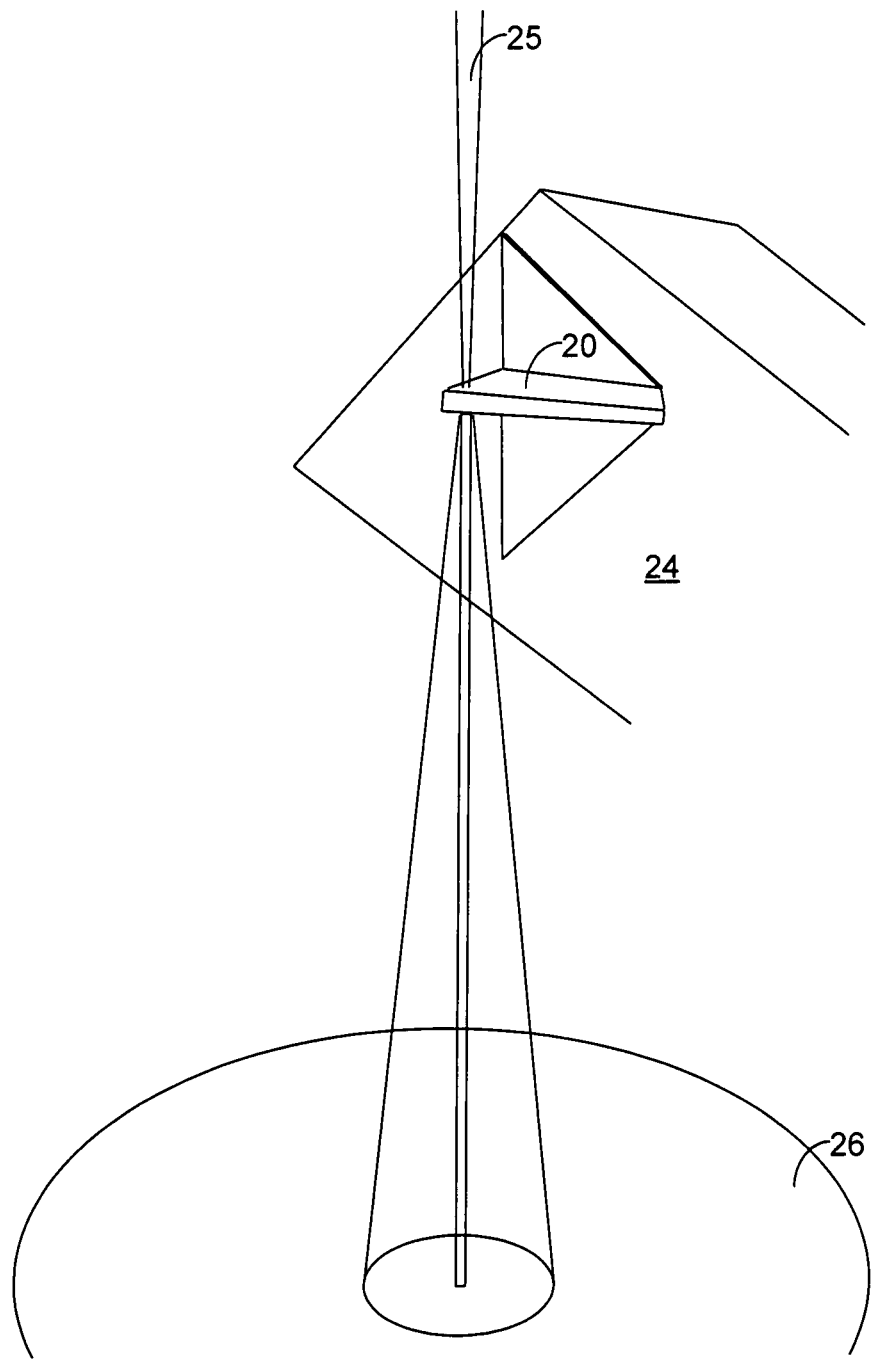
FIG. 26 illustrates imaging the thinned sample of FIGS. 23-25 using an STEM according to the present invention.

Once thinning has been completed, in step 320, the stage is tilted to a third angle for STEM imaging. The third angle and the first angle added together will preferably equal 90 degrees so that the sample face 28 can be tilted to be perpendicular to the electron beam 25 from the vertical SEM column as shown in FIG. 26. As long as the pre-tilt angle is greater than 30°, on a maximum 60° tilt stage (a typical tilt stage), the above method will work. The pre-tilt angle and the final tilt angle will follow a simple formula: $\alpha+\beta=90°$ (where $\alpha$ is the pre-tilt angle and $\beta$ is the final STEM imaging tilt angle.)

Figure 21:
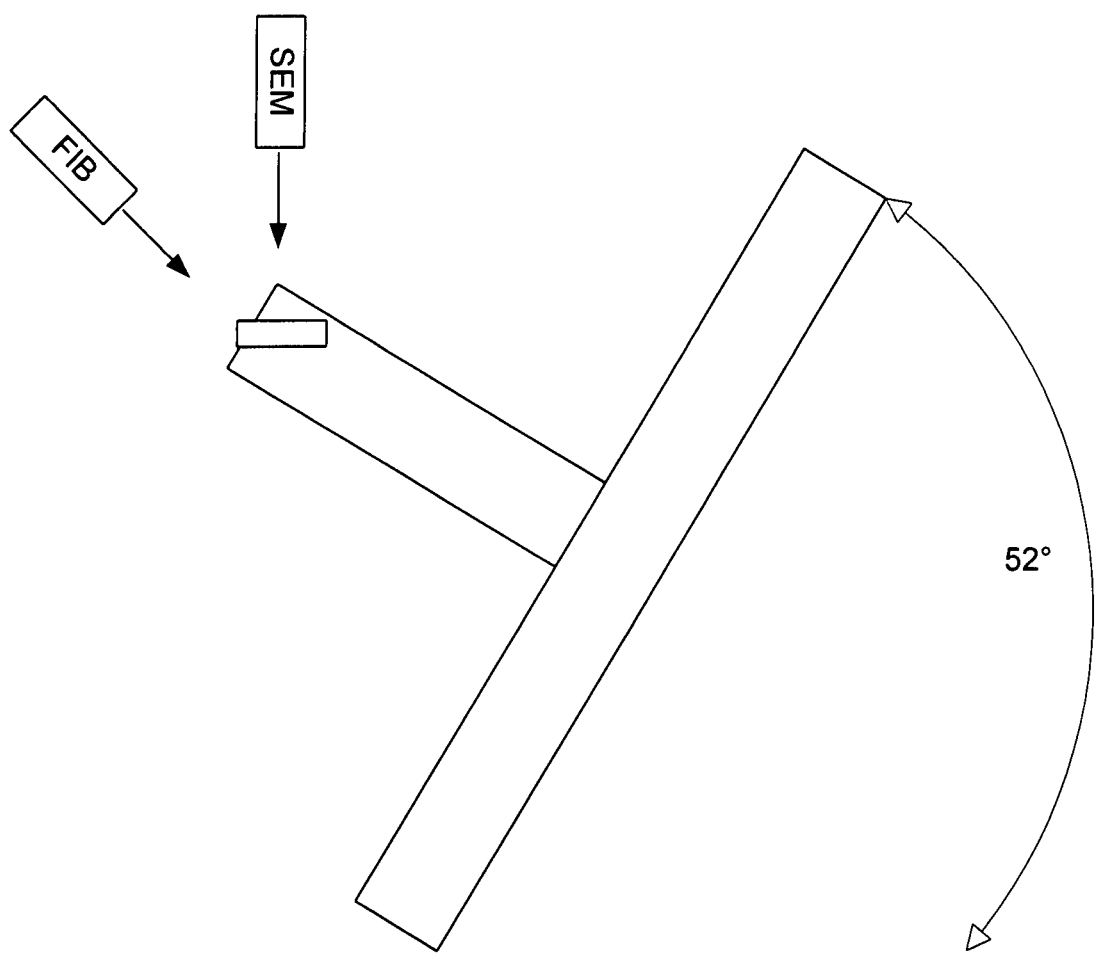

In the embodiment shown in FIG. 21, the stage is tilted to 52 degrees. Because the sample was mounted at an angle of 38 degrees, the combination of the first and third angles results in a sample face is perpendicular to the SEM column (52° plus 38°=90°). Another preferred choice of angles according to the method described above would be to pre-tilt the stage at 52° (rotation 0°) then do the thinning at 0° stage tilt (rotation 180°) and finish the final STEM image at 38° stage tilt (rotation 180°).

Finally, in step 322, once the sample has been tilted so that the sample face 28 is perpendicular to the SEM column, the sample 20 can be imaged using the electron beam 25 and STEM detector 26 as shown in FIG. 26.

Figure 22:
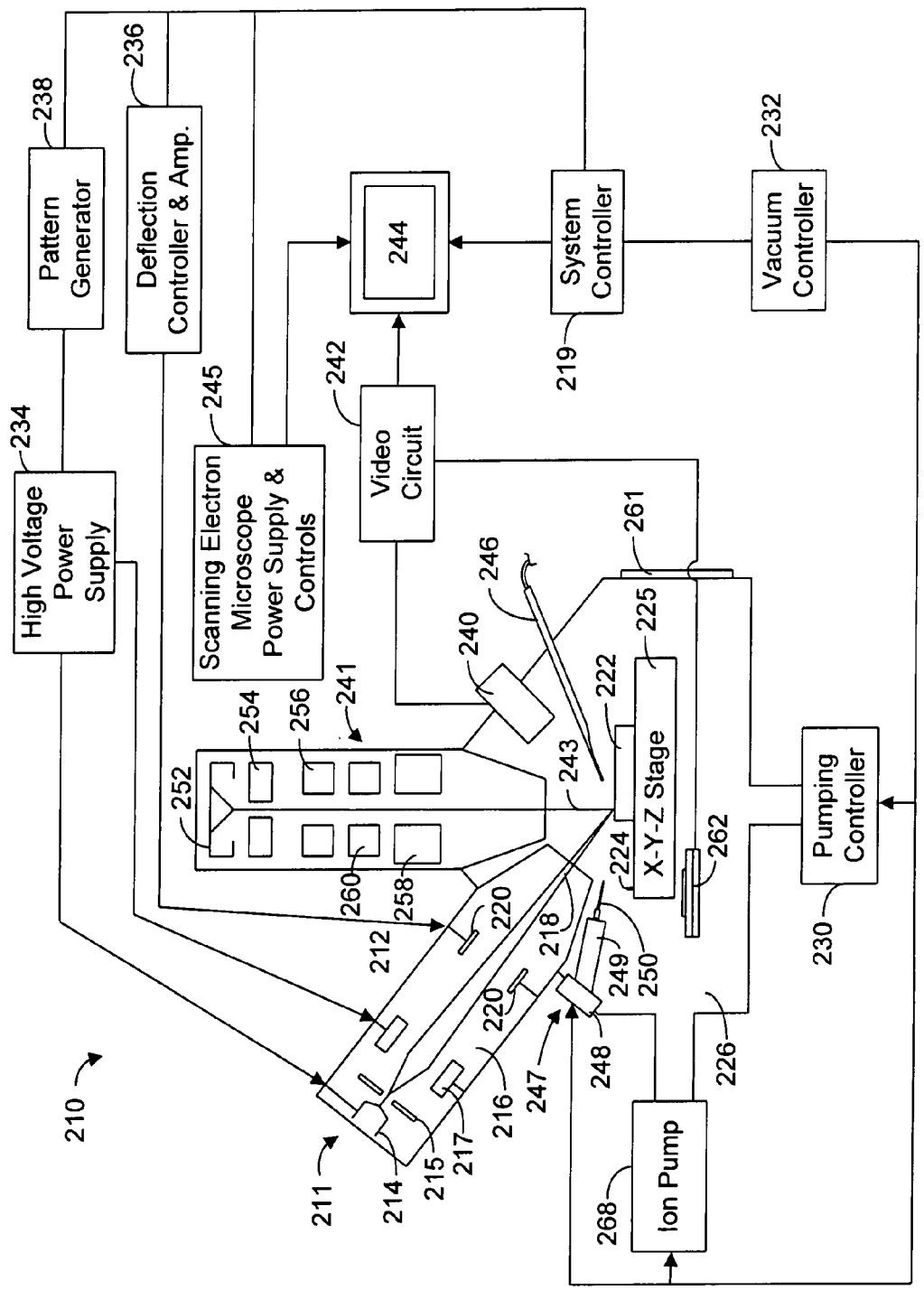
FIG. 22 shows a typical dual beam FIB/STEM system that could be used to implement the present invention.

FIG. 22 shows a typical dual beam system 210 suitable for practicing the present invention, with a vertically mounted SEM column and a focused ion beam (FIB) column mounted at an angle of approximately 52 degrees from the vertical. Suitable dual beam systems are commercially available, for example, from FEI Company, Hillsboro, Oreg., the assignee of the present application. While an example of suitable hardware is provided below, the invention is not limited to being implemented in any particular type of hardware.

A scanning electron microscope 241, along with power supply and control unit 245, is provided with the dual beam system 210. An electron beam 243 is emitted from a cathode 252 by applying voltage between cathode 252 and an anode 254. Electron beam 243 is focused to a fine spot by means of a condensing lens 256 and an objective lens 258. Electron beam 243 is scanned two-dimensionally on the specimen by means of a deflection coil 260. Operation of condensing lens 256, objective lens 258, and deflection coil 260 is controlled by power supply and control unit 245.

Electron beam 243 can be focused onto substrate 222, which is on movable X-Y stage 225 within lower chamber 226. When the electrons in the electron beam strike substrate 222, secondary electrons are emitted. These secondary electrons are detected by secondary electron detector 240 as discussed below. STEM detector 262, located beneath the TEM sample holder 224 and the stage 225, can collect electrons that are transmitted through the sample mounted on the TEM sample holder as discussed above.

Dual beam system 210 also includes focused ion beam (FIB) system 211 which comprises an evacuated chamber having an upper neck portion 212 within which are located an ion source 214 and a focusing column 216 including extractor electrodes and an electrostatic optical system. The axis of focusing column 216 is tilted 52 degrees from the axis of the electron column. The ion column 212 includes an ion source 214, an extraction electrode 215, a focusing element 217, deflection elements 220, and a focused ion beam 218. Ion beam 218 passes from ion source 214 through column 216 and between electrostatic deflection means schematically indicated at 220 toward substrate 222, which comprises, for example, a semiconductor device positioned on movable X-Y stage 225 within lower chamber 226.

Stage 225 can also support one or more TEM sample holders 224 so that a sample can be extracted from the semiconductor device and moved to a TEM sample holder. Stage 225 can preferably move in a horizontal plane (X and Y axes) and vertically (Z axis). Stage 225 can also tilt approximately sixty (60) degrees and rotate about the Z axis. In some embodiments, a separate TEM sample stage (not shown) can be used. Such a TEM sample stage will also preferably be moveable in the X, Y, and Z axes. A door 261 is opened for inserting substrate 222 onto X-Y stage 225 and also for servicing an internal gas supply reservoir, if one is used. The door is interlocked so that it cannot be opened if the system is under vacuum.

An ion pump 228 is employed for evacuating neck portion 212. The chamber 226 is evacuated with turbomolecular and mechanical pumping system 230 under the control of vacuum controller 232. The vacuum system provides within chamber 226 a vacuum of between approximately 1×10−7 Torr and 5×10−4 Torr. If an etch assisting, an etch retarding gas, or a deposition precursor gas is used, the chamber background pressure may rise, typically to about 1×10−5 Torr.

The high voltage power supply provides an appropriate acceleration voltage to electrodes in ion beam focusing column focusing 216 for energizing and focusing ion beam 218. When it strikes substrate 222, material is sputtered, that is physically ejected, from the sample. Alternatively, ion beam 218 can decompose a precursor gas to deposit a material.

High voltage power supply 234 is connected to liquid metal ion source 214 as well as to appropriate electrodes in ion beam focusing column 216 for forming an approximately 1 keV to 60 keV ion beam 218 and directing the same toward a sample. Deflection controller and amplifier 236, operated in accordance with a prescribed pattern provided by pattern generator 238, is coupled to deflection plates 220 whereby ion beam 218 may be controlled manually or automatically to trace out a corresponding pattern on the upper surface of substrate 222. In some systems the deflection plates are placed before the final lens, as is well known in the art. Beam blanking electrodes (not shown) within ion beam focusing column 216 cause ion beam 218 to impact onto blanking aperture (not shown) instead of substrate 222 when a blanking controller (not shown) applies a blanking voltage to the blanking electrode.

The liquid metal ion source 214 typically provides a metal ion beam of gallium. The source typically is capable of being focused into a sub one-tenth micrometer wide beam at substrate 222 for either modifying the substrate 222 by ion milling, enhanced etch, material deposition, or for the purpose of imaging the substrate 222.

A charged particle detector 240, such as an Everhart Thornley or multi-channel plate, used for detecting secondary ion or electron emission is connected to a video circuit 242 that supplies drive signals to video monitor 244 and receiving deflection signals from controller 219. The location of charged particle detector 240 within lower chamber 226 can vary in different embodiments. For example, a charged particle detector 240 can be coaxial with the ion beam and include a hole for allowing the ion beam to pass. In other embodiments, secondary particles can be collected through a final lens and then diverted off axis for collection.

A micromanipulator 247, such as the AutoProbe 200™ from Omniprobe, Inc., Dallas, Tex., or the Model MM3A from Kleindiek Nanotechnik, Reutlingen, Germany, can precisely move objects within the vacuum chamber. Micromanipulator 247 may comprise precision electric motors 248 positioned outside the vacuum chamber to provide X, Y, Z, and theta control of a portion 249 positioned within the vacuum chamber. The micromanipulator 247 can be fitted with different end effectors for manipulating small objects. In the embodiments described herein, the end effector is a thin probe 650.

A gas delivery system 246 extends into lower chamber 226 for introducing and directing a gaseous vapor toward substrate 222. U.S. Pat. No. 5,851,413 to Casella et al. for "Gas Delivery Systems for Particle Beam Processing," assigned to the assignee of the present invention, describes a suitable gas delivery system 246. Another gas delivery system is described in U.S. Pat. No. 5,435,850 to Rasmussen for a "Gas Injection System," also assigned to the assignee of the present invention. For example, iodine can be delivered to enhance etching, or a metal organic compound can be delivered to deposit a metal.

A system controller 219 controls the operations of the various parts of dual beam system 210. Through system controller 219, a user can cause ion beam 218 or electron beam 243 to be scanned in a desired manner through commands entered into a conventional user interface (not shown). Alternatively, system controller 219 may control dual beam system 210 in accordance with programmed instructions. In some embodiments, dual beam system 210 incorporates image recognition software, such as software commercially available from Cognex Corporation, Natick, Mass., to automatically identify regions of interest, and then the system can manually or automatically extract samples in accordance with the invention. For example, the system could automatically locate similar features on semiconductor wafers including multiple devices, and take samples of those features on different (or the same) devices.

The invention described above has broad applicability and can provide many benefits as described and shown in the examples above. The embodiments will vary greatly depending upon the specific application, and not every embodiment will provide all of the benefits and meet all of the objectives that are achievable by the invention. For example, in a preferred embodiment TEM samples are created using a gallium liquid metal ion source to produce a beam of gallium ions focused to a sub-micrometer spot. Such focused ion beam systems are commercially available, for example, from FEI Company, the assignee of the present application. However, even though much of the previous description is directed toward the use of FIB milling, the milling beam used to process the desired TEM samples could comprise, for example, an electron beam, a laser beam, or a focused or shaped ion beam, for example, from a liquid metal ion source or a plasma ion source, or any other charged particle beam. Further, although much of the previous description is directed at semiconductor wafers, the invention could be applied to any suitable substrate or surface.

Although the present invention and its advantages have been described in detail, it should be understood that various changes, substitutions and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

I claim:

1. A method for preparing a sample for TEM/STEM imaging, comprising:
    providing a substrate inside a dual beam FIB/electron beam system, and said system comprising a vertical electron beam column and a FIB column oriented at an angle relative to the electron beam column;
    providing a sample holder for holding an extracted TEM/STEM sample, the sample holder mounted on a sample stage inside the FIB/electron beam system, said sample stage having a sample stage plane and comprising a rotating and tilting stage with a maximum tilt of less than 90 degrees, and said sample holder having a sample holder plane perpendicular to the sample stage plane;
    freeing a sample from the substrate using an ion beam, said freed sample having a top surface;
    tilting the sample holder to a first angle by tilting the sample stage;
    mounting the sample onto the tilted sample holder so that the top surface of the sample is oriented at said first angle relative to the sample holder plane;
    tilting the sample stage so that the sample stage plane is at a 0 degree tilt;
    rotating the sample holder by 180 degrees;
    tilting the rotated sample holder to a second angle such that the combination of the first angle and the second angle results in the top surface of the mounted sample being oriented perpendicular to the orientation of the FIB column;
    thinning the sample using the ion beam by milling the sample, said milling producing a sample face parallel to the orientation of the FIB column;
    tilting the sample holder to third angle, such that the combination of the first angle and the third angle equals approximately 90 degrees and the sample face is oriented substantially perpendicular to the vertical electron beam column; and
    viewing the mounted sample with the TEM/STEM.

2. The method of claim 1 where said first angle is chosen from the range of angles between the maximum tilt angle of the stage and the difference between the maximum tilt and 90 degrees.

3. The method of claim 1 in which said sample stage has a maximum tilt of 60 degrees and said first angle is greater than 30 degrees.

4. The method of claim 1 where the FIB column is oriented at approximately 52 degrees from the vertical electron beam column.

5. The method of claim 1 in which the sample holder is a TEM finger grid.

6. The method of claim 1 further comprising viewing the mounted sample using a scanning electron microscope.

7. The method of claim 1 further comprising imaging the mounted sample during ion beam milling using SEM or STEM.

8. The method of claim 1 in which tilting the sample holder to a first angle comprises tilting the sample holder to approximately 38 degrees.

9. The method of claim 8 in which tilting the sample holder to a second angle comprises tilting the sample holder to approximately 14 degrees.

10. The method of claim 9 in which tilting the sample holder to a third angle comprises tilting the sample holder to approximately 52 degrees.

11. The method of claim 1 in which tilting the sample holder to a first angle comprises tilting the sample holder to approximately 52 degrees.

12. The method of claim 11 in which tilting the sample holder to a third angle comprises tilting the sample holder to approximately 38 degrees.

13. The method of claim 1 in which thinning the sample using the ion beam further comprises tilting the sample stage during the milling process.

14. The method of claim 1 in which thinning the sample using the ion beam comprises thinning the sample into an electron-transparent thin section.

* * * * *